(12) United States Patent
Jarmolowitz et al.

(10) Patent No.: US 12,019,112 B2
(45) Date of Patent: Jun. 25, 2024

(54) METHOD FOR MONITORING A POWER SUPPLY IN A MOTOR VEHICLE WITH WIRING HARNESS MODEL

(71) Applicant: Robert Bosch GmbH, Stuttgart (DE)

(72) Inventors: Fabian Jarmolowitz, Kassel (DE);
Juergen Motz, Steinheim An der Murr (DE); Patrick Lueckel, Stuttgart (DE);
Quang-Minh Le, Hemmingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 812 days.

(21) Appl. No.: 17/258,156

(22) PCT Filed: Jun. 22, 2019

(86) PCT No.: PCT/EP2019/066563
§ 371 (c)(1),
(2) Date: Jan. 6, 2021

(87) PCT Pub. No.: WO2020/020548
PCT Pub. Date: Jan. 30, 2020

(65) Prior Publication Data
US 2021/0285997 A1    Sep. 16, 2021

(30) Foreign Application Priority Data

Jul. 25, 2018   (DE) .......................... 102018212369.1

(51) Int. Cl.
*H01M 10/44* (2006.01)
*B60R 16/033* (2006.01)
(Continued)

(52) U.S. Cl.
CPC .......... *G01R 31/007* (2013.01); *B60R 16/033* (2013.01); *G05D 1/0061* (2013.01);
(Continued)

(58) Field of Classification Search
CPC ........ H02J 7/00; H02J 7/0047; G07C 5/0816; G07C 5/0808; B60R 16/033;
(Continued)

(56) References Cited

U.S. PATENT DOCUMENTS 5,418,453 A    5/1995  Wise
9,632,125 B2*  4/2017  Wang ...................... B60L 58/12
(Continued)

FOREIGN PATENT DOCUMENTS

CN    102629869 A    8/2012
CN    105531155 A    4/2016
(Continued)

OTHER PUBLICATIONS

Translation of DE102015111094A1 (Jan. 28, 2016) (Year: 2016).*
International Search Report for PCT/EP2019/066563, Issued Sep. 19, 2019.

*Primary Examiner* — Edward Tso
(74) *Attorney, Agent, or Firm* — NORTON ROSE FULBRIGHT US LLP; Gerard A. Messina (57) ABSTRACT

A method for monitoring an energy supply in a motor vehicle. At least one energy reservoir supplies energy to several preferably safety-relevant loads in a partial vehicle electrical system. At least one measured variable of an energy reservoir and/or of at least one load is detected. At least one wiring harness model is provided which models the partial vehicle electrical system. A parameter estimator is provided which assesses at least one characterizing variable of the wiring harness model using the measured variable.

20 Claims, 4 Drawing Sheets

(51) Int. Cl.
*G01R 31/00* (2006.01)
*G05D 1/00* (2006.01)
*G07C 5/08* (2006.01)

(52) U.S. Cl.
CPC ......... *G07C 5/0808* (2013.01); *G07C 5/0816* (2013.01); *B60L 2260/54* (2013.01); *Y02T 10/84* (2013.01)

(58) Field of Classification Search
CPC ... G05D 1/0061; B60L 2260/54; Y02T 10/72; Y02T 10/84; Y02T 10/70
USPC ................................ 320/104, 107, 132, 149
See application file for complete search history.

(56) References Cited

U.S. PATENT DOCUMENTS

| | | | | |
|---|---|---|---|---|
| 11,173,775 | B2* | 11/2021 | He | B60W 10/06 |
| 2010/0265051 | A1* | 10/2010 | Sivertsen | B60L 58/21 |
| | | | | 340/438 |
| 2012/0029852 | A1 | 2/2012 | Goff et al. | |
| 2016/0025789 | A1* | 1/2016 | Wang | G01R 31/007 |
| | | | | 324/503 |

FOREIGN PATENT DOCUMENTS

| | | |
|---|---|---|
| CN | 105721375 A | 6/2016 |
| DE | 102015111094 A1 | 1/2016 |
| DE | 102015221725 A1 | 5/2017 |
| DE | 102016221249 A1 | 5/2018 |
| DE | 102017218446 A1 | 5/2018 |
| EP | 1231475 A2 | 8/2002 |
| JP | H09261845 A | 10/1997 |
| JP | 2007253879 A | 10/2007 |
| JP | 2014104888 A | 6/2014 |
| JP | 2017190090 A | 10/2017 |
| WO | 2013104423 A1 | 7/2013 |
| WO | 2015135729 A1 | 9/2015 |

* cited by examiner

METHOD FOR MONITORING A POWER SUPPLY IN A MOTOR VEHICLE WITH WIRING HARNESS MODEL

FIELD

The present invention relates to a method for monitoring an energy supply in a motor vehicle, in particular having an automated driving mode.

BACKGROUND INFORMATION

The purpose of the vehicle electrical system is to supply energy to electrical loads. In present-day vehicles, if the energy supply fails because of a fault in or aging of the electrical system or of an electrical-system component, important functions such as power steering then become unavailable. Because the steerability of the vehicle is not impaired but simply becomes heavy, failure of the electrical system in present-day production vehicles is generally accepted, since the driver is available as a fallback level. Two-channel electrical system structures have been described, e.g. in PCT Application No. WO 2015/135729 A1, in order to increase availability. These are needed in order to provide fault-tolerant power to systems for the highly or fully automated driving mode.

German Patent Application No. DE 10 2015 221 725 A1 describes a method for monitoring a vehicle electrical system. It encompasses at least one channel having at least one component and an energy supply system, a terminal voltage being measured at a component and being compared with a voltage that the energy supply system furnishes. In addition, a further measurement is carried out in a further state in the context of a further current draw and is compared with the first measurement, and a contact resistance to that component is ascertained therefrom in consideration of a current that flows into the component in the further state.

In order to determine the lead resistance, the measured variables necessary for the calculation (for example, the battery voltage, a further voltage in the lead, and the battery current) need to be detected only once. In the second step the resistance is then ascertained by calculation with the aid of Ohm's law.

If an expansion of the network then occurs, for example by addition of further current sections for further energy sources and loads, the number of unknowns (conductor resistances of the individual sections) and the boundary conditions (nodal equations) then increases. In this situation the system is underdetermined, i.e., the number of unknowns (for example, the conductor resistances) is greater by one than the number of nodal equations. The above-described direct approach to determining the individual conductor resistances therefore cannot be used.

An object of the present invention is to further increase monitoring reliability. This object may be achieved by way of example embodiments of the present invention.

SUMMARY

Monitoring reliability can be further increased by the fact that according to an example embodiment of the present invention, a parameter estimation method is employed in order to determine the relevant characterizing variables of the vehicle electrical system, in particular the contact resistance. With the assistance of several measurements at different points in time (time course) it is possible to ascertain the characteristic variables even of an underdetermined system, since the time-related correlation (the characteristic variables of the vehicle electrical system, for example the conductor resistances, remain approximately constant) results in further equations for determining the characteristic variables or resistances. The combination of several measurements at different points in time by way of parameter estimation methods is then used according to the present invention to ascertain specific characteristic variables for the vehicle electrical system. Specifically in the context of branched vehicle electrical systems, utilization of a time-related correlation allows sufficient information to be supplied for simultaneous estimation of several characterizing variables of the vehicle electrical system (contact resistances), even when measurement points are absent.

Resorting to such estimation methods also offers the advantage that they supply not only the estimated value itself, but also an estimate quality (for example, the variance of the estimate), so that here the reliability of the ascertained characterizing variables can be assessed. That reliability can be used as a further criterion specifically for enabling safety-relevant functions, for example in the automated driving mode.

The characterizing variables that are to be estimated, in particular the contact resistances or resistances, can furthermore be determined simultaneously and mutually independently. The only prerequisite is that a corresponding excitation be present in the respective section.

In particular thanks to the addition of further, additional measured variables (for example, by the use of central current/power distributors), this additional information can be used in order to increase the statistical certainty of the results, for example by selecting the most accurate measurement sensors or by fusion of the measured data. The failure probability of the system can furthermore be reduced thanks to the additional redundancy.

Particularly usefully, in accordance with an example embodiment of the present invention, the parameter estimation can be specifically carried out only when it can be ensured that the current for excitation of the respective section has sufficient intensity. A prefilter apparatus, for instance a logic system, could be installed, for example, for that purpose, said apparatus then evaluating the measured current intensity and comparing it with a threshold value. If the measured current of a vehicle electrical system section exceeds the threshold value, the parameter estimation of the corresponding characterizing variable can be started. The quality of the diagnostic result can thereby be further improved. If the corresponding threshold value happens not to be exceeded, updating of the estimated value for that time step is discontinued. The reliability of the assemblage is thereby further improved.

Particularly usefully, in accordance with an example embodiment of the present invention, a specially optimized excitation is provided in order to improve the estimation quality. This is advantageously possible in particular when it does not impair the operation of the vehicle electrical system. Particularly preferably, a redundant channel or vehicle electrical system branch is provided for this.

In a useful refinement of the present invention, the measured variables used in order to determine the characterizing variables are synchronized, in particular by a filter, preferably a fractional delay filter, a Lagrange filter, a Farrow filter, or similar methods. Distortion of a diagnostic result due to possible asynchronicity of the measured variables, for example due to non-synchronous clocks, can thereby be reduced.

Particularly usefully, in accordance with an example embodiment of the present invention, a filter determines a delay factor for time synchronization of the measured variables for all the measured variables that are to be delayed. Particularly usefully, the delay factor of the filter is also determined by way of a parameter estimator. A high signal quality for the delayed signals can thereby be achieved with little computation outlay for estimating the delay factor.

Further useful refinements of the present invention are evident from the description herein and the figures.

DETAILED DESCRIPTION OF EXAMPLE EMBODIMENTS

The present invention is schematically depicted in the figures on the basis of example embodiments, and will be described below in detail with reference to the figures.

A battery or rechargeable battery is described in the exemplifying embodiment, by way of example, as a possible energy reservoir. Alternatively, however, other energy reservoirs suitable for this purpose, for example inductively or capacitively based, fuel cells, capacitors, or the like, can also be used.

Figure 1:
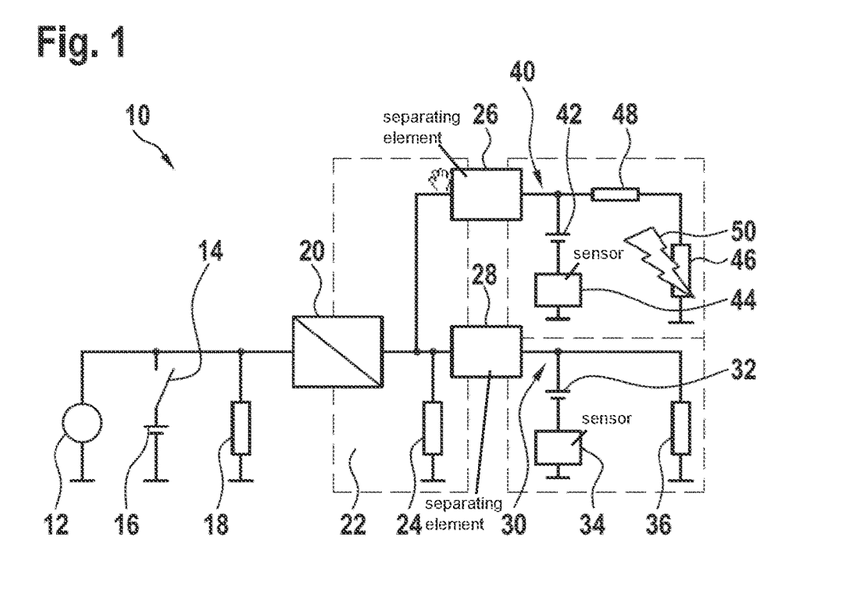
FIG. 1 shows a possible electrical system for a vehicle for automated driving, in accordance with an example embodiment of the present invention.

FIG. 1 shows a possible topology of an energy supply system made up of a basic vehicle electrical system 22 that supplies power to at least one basic load 24 that is depicted by way of example. Alternatively, an energy reservoir or a battery having an associated (battery) sensor, and/or a starter, and/or several non-safety-relevant comfort loads, which can be protected or controlled by an electrical load distribution system, could also be provided in basic vehicle electrical system 22. Basic vehicle electrical system 22 has a voltage level that is lower with respect to a high-voltage vehicle electrical system 10; it can be, for example, a 14 V vehicle electrical system. A DC voltage converter 20 is disposed between basic vehicle electrical system 22 and high-voltage vehicle electrical system 10. High-voltage vehicle electrical system 10 encompasses, by way of example, a high-voltage energy reservoir 16 such as a high-voltage battery, possibly having an integrated battery management system; a non-safety-relevant load 18 or comfort load (shown by way of example), for example a climate control system etc. powered at an elevated voltage level; and an electric machine 12. Energy reservoir 16 can be switched in via a switching means (i.e., a switch) 14 in order to supply power to high-voltage vehicle electrical system 10. "High voltage" is understood in this connection as a voltage level that is higher than the voltage level of basic vehicle electrical system 22. This could refer, for example, to a 48 V vehicle electrical system. Alternatively, specifically in the case of electrically propelled vehicles, it could refer to even higher voltage levels. Alternatively, high-voltage vehicle electrical system 10 could be entirely absent, in which case components such as starters, generators, and energy reservoirs are associated with the basic vehicle electrical system.

Two safety-relevant partial vehicle electrical systems 30, 40, for example, are connected to basic vehicle electrical system 22. First safety-relevant partial vehicle electrical system 30 is connected to basic vehicle electrical system 22 via a separating element 28. Further safety-relevant partial vehicle electrical system 40 is connected to basic vehicle electrical system 22 via a further separating element 26. First safety-relevant partial vehicle electrical system 30 can be supplied with energy via an energy reservoir 32. The characteristic characterizing variables of energy reservoir 32 are detected by a sensor 34. Sensor 34 is preferably disposed adjacently to energy reservoir 32. First safety-relevant partial vehicle electrical system 30 powers a safety-relevant load 36. This safety-relevant load 36 is shown merely by way of example. Further safety-relevant loads 36 are also powered via partial vehicle electrical system 30 as necessary, as described in further detail below.

Further safety-relevant partial vehicle electrical system 40 is also powered by way of a further energy reservoir 42. The characterizing variables of further energy reservoir 42 are detected by a further sensor 44. Further sensor 44 is disposed adjacently to further energy reservoir 42. Further safety-relevant vehicle electrical system 40 powers at least one further safety-relevant load 46. Further safety-relevant loads 46 can also be powered, as necessary, in further safety-relevant partial vehicle electrical system 40. A fault 50 is indicated in further safety-relevant partial vehicle electrical system 40; it could result in an elevated wiring harness resistance 48.

As will be discussed in further detail below, a wiring harness diagnosis, which reliably recognizes such faults 50, is carried out using a parameter estimator 104.

The redundant, in particular functionally redundant, safety-relevant loads 36, 46 to which power can be supplied via the two safety-relevant partial vehicle electrical systems 30, 40 are those that are necessary in order to transfer a vehicle, for example in critical fault instances, from an automated driving mode (no intervention by the driver necessary) to a safe state. As described in further detail below, this can involve bringing the vehicle to a stop, whether immediately, by the side of the road, or only at the next rest area, etc.

The following safety-relevant loads 36, 46 are provided by way of example; this involves at least a braking system 60. Braking functionality can be achieved either by way of a first component or load 62 (for example, a so-called electronic stability program that can bring the vehicle to a standstill) to which power is supplied via partial vehicle electrical system 30. Alternatively, redundant braking functionality is achieved via a further component or further load 64 (for example a so-called iBooster that generates brake pressure electromechanically). Further load 64 is powered via further safety-relevant channel 40. Redundant energy supply is possible via the two safety-relevant partial vehicle electrical systems 30, 40, so that reliable braking of the vehicle is still possible even upon failure of one of partial vehicle electrical systems 30, 40.

A further safety-relevant component that is provided, for example, is a steering system 66. Steering system 66 is made up of a first component or load 68, for example in the form of an electrical steering system that is powered by partial vehicle electrical system 30. Steering system 66 furthermore encompasses a further component or load 70 (also, for example, an electrical steering system) that can likewise steer the vehicle in a desired manner independently of first component 68. Further component or load 70 is supplied with energy by further safety-relevant partial vehicle electrical system 40.

An automated driving function 78 is provided as a further safety-relevant component that is embodied redundantly. A pertinent first computing unit 80 and a first sensor unit 74 are thus supplied with energy from first channel 30. Automated driving function 78 can be implemented redundantly by way of a further computing unit 82 and one or several sensor units 76, which are powered by further safety-relevant channel 40. Trajectory planning, with associated control application values for the requisite actuators, is accomplished, for example, in computing units 80, 82. Sensor units 74, 76 respectively make available the current environmental information of the vehicle for trajectory planning.

Figure 2:
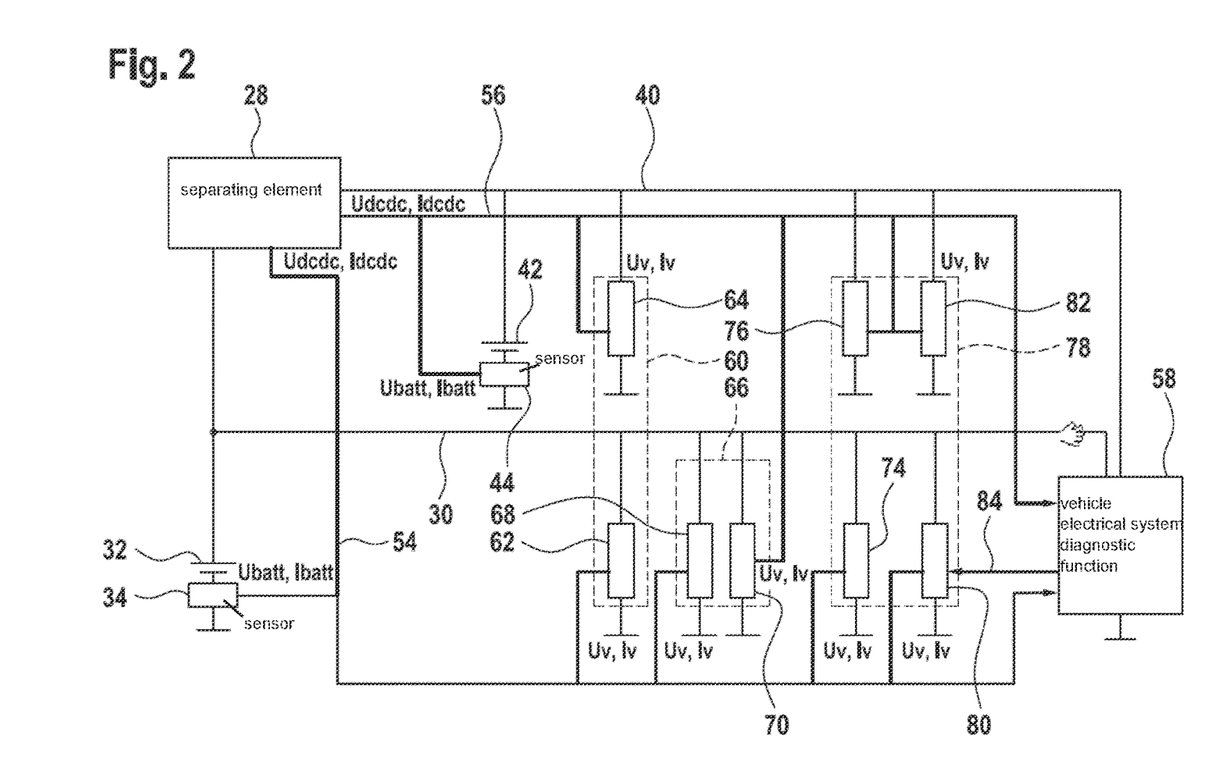
FIG. 2 shows a power-supply and data structure for two safety-relevant channels for vehicle electrical system diagnosis, in accordance with an example embodiment of the present invention.

Data connections 54, 56 are also indicated in the exemplifying embodiment according to FIG. 2. Data connections 54, 56 convey the detected data, in particular current values and/or voltage values at separating element 26, 28 and/or at energy reservoirs 32, 42, as ascertained e.g. via sensors 34, 44, and/or at safety-relevant loads 62, 64, 68, 70, 74, 76, 80, 82, to a vehicle electrical system diagnostic function 58. For example, a first data connection 54 conveys to vehicle electrical system diagnostic function 58 the data of those components which are powered by partial vehicle electrical system 30. A further data connection 56 conveys to vehicle electrical system diagnostic function 58, for example, the data of those components which are supplied with energy by further partial vehicle electrical system 40. Data connections 54, 56 can be suitable bus systems, for example a LIN bus or CAN bus.

Specifically, data connection 54 conveys relevant current and voltage values of separating means (element) or coupling means (element) 28 (Udcdc, Idcdc). Sensor 34, in particular a battery sensor, detects the voltage Ubatt at energy reservoir 32 and/or the current Ibatt of energy reservoir 32 and/or further states or parameters of a model of energy reservoir 32. The instantaneous currents Iv at the individual loads 62, 64, 68, 70, 74, 76, 80, 82, or instantaneous voltages Uv (terminal voltages) of the individual loads 62, 64, 68, 70, 74, 76, 80, 82 at the respective terminals of those terminals 62, 64, 68, 70, 74, 76, 80, 82, are also available for conveyance to vehicle electrical system diagnostic function 58.

Figure 3:
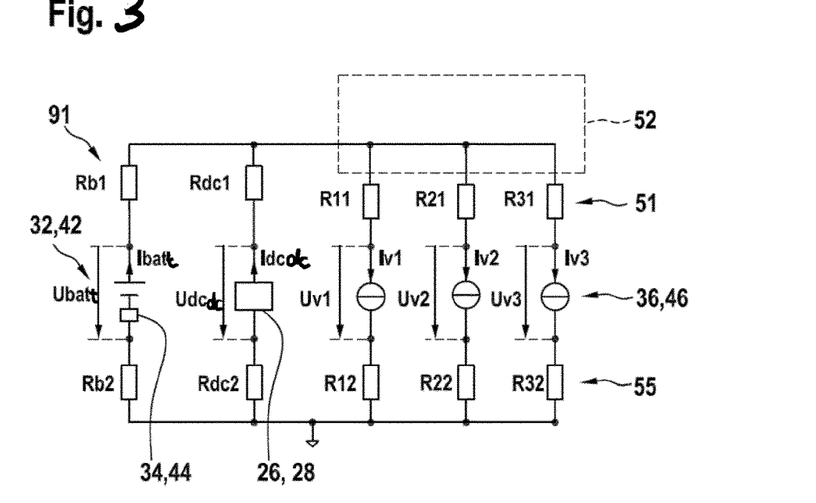
FIG. 3 shows an equivalent circuit diagram or model of an energy reservoir, in accordance with an example embodiment of the present invention.

FIG. 3 illustrates, by way of example, wiring harness model 91 based on a typical partial vehicle electrical system 30, 40. Here a partial vehicle electrical system 30, 40 in accordance with FIGS. 1 and 2, and having the relevant vehicle electrical system components, is provided, made up of a DC voltage converter (separating element 26, 28), energy reservoir 32, 42 having sensor 34, 44, wiring harness branches with the corresponding positive-side lead resistances including conductor resistances 51 (positive-side resistances, index 1 Rx1: R11, R21, R31), and ground-side lead resistances including contact resistances 55 (ground-side resistances, index 2 Rx2: R12, R22, R32), and having a variety of safety-relevant loads 36, 46 characterized by the pertinent load currents Iv1, Iv2, Iv3 and terminal voltages Uv1, Uv2, Uv3 for, by way of example, three loads 36, 46. Control is applied to loads 36, 46 by a current distributor 52. This structure forms the basis for wiring harness model 91. The wiring harness resistances (positive-side conductor resistances including contact resistances 51, ground-side lead resistances including contact resistances 55) are assessed by way of a parameter estimation method, as explained in further detail below. The currents Iv and voltages Uv required for calculation of the wiring harness resistances (positive-side conductor resistances including contact resistances 51, ground-side lead resistances including contact resistances 55) are furnished, by components that contain the measurement apparatuses, via the above-described communication network (data connections 54, 56).

Resistances Rb1, Rb2 represent lead resistances 51, including contact resistances 55, to the corresponding component. Positive-side resistances (index 1) and ground-side resistances (index 2) Rxy, 51, 55 are assessed according to the present invention in total, i.e., for example for the transition resistance of energy reservoir 32 on the positive side Rb1 and on ground side Rb2, as follows:

$$R_{B1,B2} = R_{B1} + R_{B2}$$

Faults that occur in a section can therefore be recognized on both conductors, but cannot be distinguished. The same is correspondingly true for the lead resistances of separating element 26 (Rdc1+Rdc2=Rdc1,dc2; R11+R12=R11,12; R21+R22=R21,22; R31+R32=R31,32). The above-described resistances are corresponding characterizing variables of wiring harness model 92, and are subsequently combined into a state vector Xk.

The voltage and current measurements that are present are inserted into the equivalent circuit diagram as $U_{BATT}$, $I_{BATT}$ etc.

The result is the equation system below, which describes the vehicle electrical system model or wiring harness model 91 of the respective partial vehicle electrical system 30, 40:

$$U_{Batt} = U_{DCDC} - I_{DCDC} \cdot R_{DC1,DC2} + I_{Batt} \cdot R_{B1,B2}$$

$$U_{DCDC} = U_{Batt} - I_{Batt} \cdot R_{B1,B2} + I_{DCDC} \cdot R_{DC1,DC2}$$

$$U_{V1} = U_{Batt} + I_{Batt} \cdot R_{B1,B2} - I_{V1} \cdot R_{11,12}$$

$$U_{V2} = U_{Batt} + I_{Batt} \cdot R_{B1,B2} - I_{V2} \cdot R_{21,22}$$

$$U_{V3} = U_{Batt} + I_{Batt} \cdot R_{B1,B2} - I_{V3} \cdot R_{31,32}$$

for each of the (by way of example, three) loads 36, 46 powered from current distributor 52, energy reservoirs 34, 44, and separating elements 26, 28 shown in FIG. 3.

The above equation system describing partial vehicle electrical system 30, 40 can be described, in the form of the relevant characterizing variables of partial vehicle electrical system 30, 40, namely the sum of the corresponding positive-side lead resistances including contact resistances 51, and ground-side lead resistances including contact resistances 55 in the respective branches, as a parameter vector $x_k$. The parameter vector $x_k$ can be updated for each new time step using parameter estimator 104, based on corresponding measured values that are combined into the vector $z_k$.

The corresponding variables as described are combined below into corresponding vectors or matrices:

$$x_k = \begin{bmatrix} R_{B1,B2} \\ R_{DC1,DC2} \\ R_{11,12} \\ R_{21,22} \\ R_{31,32} \end{bmatrix}, \quad f(\hat{x}_{k-1}, u_k) = \hat{x}_{k-1}, \quad z_k = \begin{bmatrix} U_{Batt} \\ U_{DCDC} \\ U_{V1} \\ U_{V2} \\ U_{V3} \end{bmatrix}$$

$$h(\hat{x}_k^-, 0) = \begin{bmatrix} U_{DCDC} - I_{DCDC} \cdot R_{DC1,DC2} + I_{Batt} \cdot R_{B1,B2} \\ U_{Batt} - I_{Batt} \cdot R_{B1,B2} + I_{DCDC} \cdot R_{DC1,DC2} \\ U_{Batt} + I_{Batt} \cdot R_{B1,B2} - I_{V1} \cdot R_{11,12} \\ U_{Batt} + I_{Batt} \cdot R_{B1,B2} - I_{V2} \cdot R_{21,22} \\ U_{Batt} + I_{Batt} \cdot R_{B1,B2} - I_{V3} \cdot R_{31,32} \end{bmatrix}$$

Figure 4:
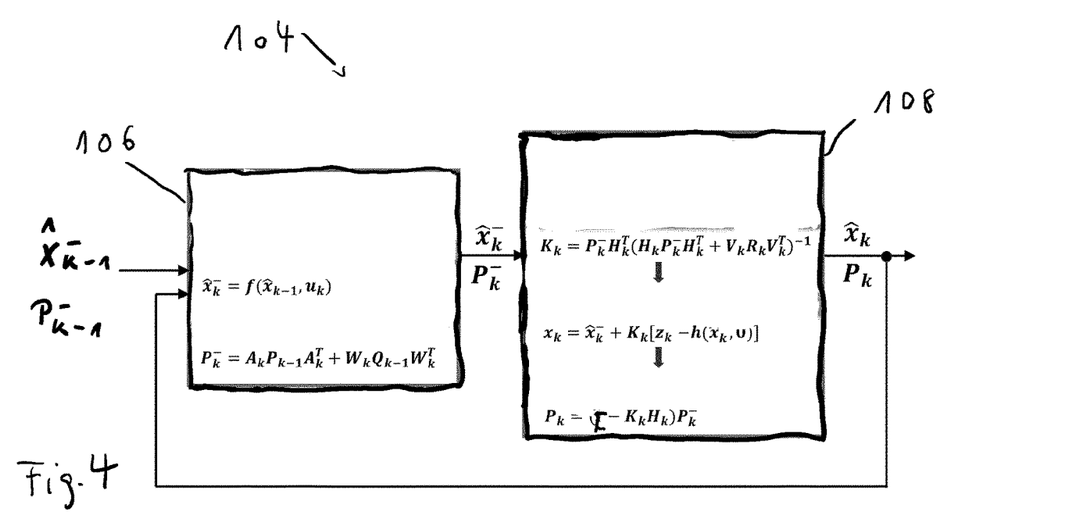
FIG. 4 shows the structural configuration of the parameter estimator, in accordance with an example embodiment of the present invention.

In the exemplifying embodiment a so-called extended Kalman filter (EKF) is used, as shown in FIG. 4, as a parameter estimator 104 to recursively solve the equation system. Alternatively, further parameter estimators 104 such as (recursive) least square methods, or further state estimators such as standard/unscented Kalman filters, particle filters, or similar estimation or optimization methods could also be used.

Parameter estimator 104 in accordance with the exemplifying embodiment shown in FIG. 4 encompasses at least one predictor (prediction block) 106. The input variables that arrive at predictor 106 are an initial estimate $\hat{x}_{k-1}$, of the variable $x_k$, and an initial estimate $P_{k-1}$ of the error covariance $P_k$. Also arriving as input variables into predictor 106 in the stabilized state are the instantaneously ascertained output values from a corrector (correction block) 108, namely the instantaneous parameter vector $x_k$ as well as the instantaneous error covariance $P_k$.

An update or time update occurs in predictor 106, a state prediction of the state variable $x_k$ being made in the form of the equation $$\hat{x}_k^- = f(\hat{x}_{k-1}, u_k).$$

A prediction of the error covariance matrix $P_k$ is also made in predictor 106, in the form of the equation $$P_k^- = A_k P_{k-1} A_k^T + W_k Q_{k-1} W_k^T$$

where
$A_k$=Jacobi matrix of $f(\hat{x}_{k-1}, u_k)$;
$W_k$=system matrix of the system noise
$Q_{k-1}$=variance of the system noise.

The output variables $\hat{x}_k^-$ and $P_k^-$ arrive as input variables at corrector 108. In corrector 108, the estimated values are updated on the basis of the measurement(s). Firstly the so-called Kalman gain $K_k$ is calculated using the formula $$K_k = P_k^- H_k^T (H_k P_k^- H_k^T + V_k R_k V_k^T)^{-1}$$

where
$H_k$=Jacobi matrix of $h(\hat{x}_k, 0)$;
$V_k$=system matrix of the measurement noise.

The estimate update is then performed in corrector 108 based on the measurement, according to the formula $$\hat{x}_k = \hat{x}_k^- + K_k[z_k - h(\hat{x}_h^-, 0)]$$

Lastly, an update of the error covariance $P_k$ occurs in corrector 108, in accordance with the formula $$P_k = (I - K_k H_k) P_k^-$$

where I corresponds to the identity matrix.

An estimate of the expected value and of the covariance of the characterizing variables $\hat{x}_k$ is thus made. In a first step of the filtering operation, the estimate preceding in time is subjected to the state dynamic in order to obtain a prediction for the instantaneous point in time. The predictions are corrected in corrector 108 with the new information from the instantaneous measured values, and yield the desired instantaneous estimate.

Measured Data Fusion and Selection

As a result of the addition of further, additional measured variables, for instance by the use of (further) central current distributors or power distributors 52, this additional information can be used to increase the statistical certainty of the results, for instance by selecting the most accurate measurement sensors or by fusion of the measured data. In addition, the failure probability of the system can be decreased thanks to the additional redundancy. The parameter estimate can be adapted by incorporating the further measured variables into $h(\hat{x}_k, 0)$ and $z_k$.

Selective Estimation Method

The prerequisite for a good diagnostic result is that the excitation current have sufficient amplitude. It is therefore advantageous to carry out parameter estimation 104 specifically only when it is possible to ensure that the current Iv for exciting the respective section has sufficient intensity. This can be accomplished, for instance, by installing a prefilter apparatus such as a logic system, which then evaluates the measured current intensity Iv and compares it with a threshold value (e.g., 15 A). If the measured current Iv of a vehicle electrical system section is equal, for example, to 20 A, and thus exceeds the threshold value, parameter estimation 104 of the corresponding conductor resistance 51 can be started. Otherwise estimation of the resistance 51 for the instantaneous measured sample is discontinued. For that purpose, the matrices of the extended Kalman filter for the corresponding measurement equation are not updated in that time step.

An active diagnosis with specially optimized excitations in order to improve the estimation quality is also possible, if they do not interfere with operation of the vehicle electrical system. A redundant channel or partial vehicle electrical system 30, 40 is ideal for this.

Online Estimation and Compensation for Systematic Measurement Errors

In principle, measurement errors, i.e., errors in the actual measurement operation, encompass systematic (epistemic) and random (aleatoric) errors. The latter derive from random physical processes and cannot be influenced without a change in the physical measurement principle. Systematic errors, however, are based on deterministic correlations. If it is possible to estimate those correlations online, i.e., during operation, that error source can be eliminated.

For that purpose, the existing estimation model can be supplemented with a so-called interference variable model. The interference variable model describes the influence of unknown states on the measurement result (here, the systematic measurement error). To compensate for the systematic measurement error, those unknown parameters must be estimated in addition to conductor resistances 51. This is possible in a context of sufficient measurement points (observability).

A model for systematic measurement errors that is common in practice is the linear correlation $$\hat{m} = a \cdot m + b.$$

where m represents the physical variable to be measured, for example, in vehicle electrical system 30, 40, the current Iv or voltage Uv. Correspondingly, $\hat{m}$ is the generally divergent measurement. The parameters a,b correspond to gain and bias (constant overlaid variable). A perfect sensor would exist if a=1,b=0. If a,b can be estimated (also called "calibration"), the systematic measurement error can then be compensated for.

In most cases, several sensors 34, 44 and corresponding systematic measurement errors are present in the vehicle electrical system. Only the cumulative influence of those errors on the estimate of conductor and contact resistances 51, 55 is relevant, however, in terms of estimating those resistances 51, 55. The additional parameters to be estimated can therefore be greatly reduced, which is usually what makes calibration possible in the first place. In order to estimate, for instance, three resistances 51, 55 and corresponding measurement points, the voltage U1 in the first section is obtained as $$U_1 = U_{2,m} - I_{2,m}R_2 + I_{1,m}R_1.$$

If the above model for the systematic measurement errors is then accepted, the result is $$U_1 = a_1U_2 + b_1 - (a_2I_2 + b_2)R_2 + (a_3I_1 + b_3)R_1 =$$
$$a_1U_2 - a_2I_2R_2 + a_3I_1R_1 + \underbrace{(b_1 - b_2R_2 + b_3R_1)}_{\hat{b}_1}$$

What needs to be estimated in order to compensate for the bias error is therefore not the bias $b_1$, $b_2$, $b_3$ but merely the cumulative bias $\hat{b}_1$ The same is possible, depending on the availability of measurement points, for the gain error; the procedure here is the same. A combination of the two calibration approaches is also possible, on condition that suitable excitations are present.

The estimate of the systematic measurement error can furthermore be used for a diagnosis of the measurement points, and they can be recognized as erroneous in the event of large errors. This additional information can be fundamental for sufficient ASIL qualification, of which the diagnosability of the measurement points is also a part.

If an estimation method that also takes into account random measurement errors is used, the measurement equation can be expanded to include random variables $\epsilon$, for example yielding $\hat{m}=(a \cdot m+b)+\epsilon$. Parameter estimation can be adapted by including the further parameters in $h(\hat{x}_k^-, 0)$ and $\hat{x}_k$ The estimation method, e.g. a Kalman filter, then supplies, whenever possible, an estimate of the lead and contact resistances 51, 55 and of the (if applicable) cumulative parameters of the measurement equations with minimal variance, i.e., with the greatest possible estimation quality.

Time Synchronization

Figure 5:
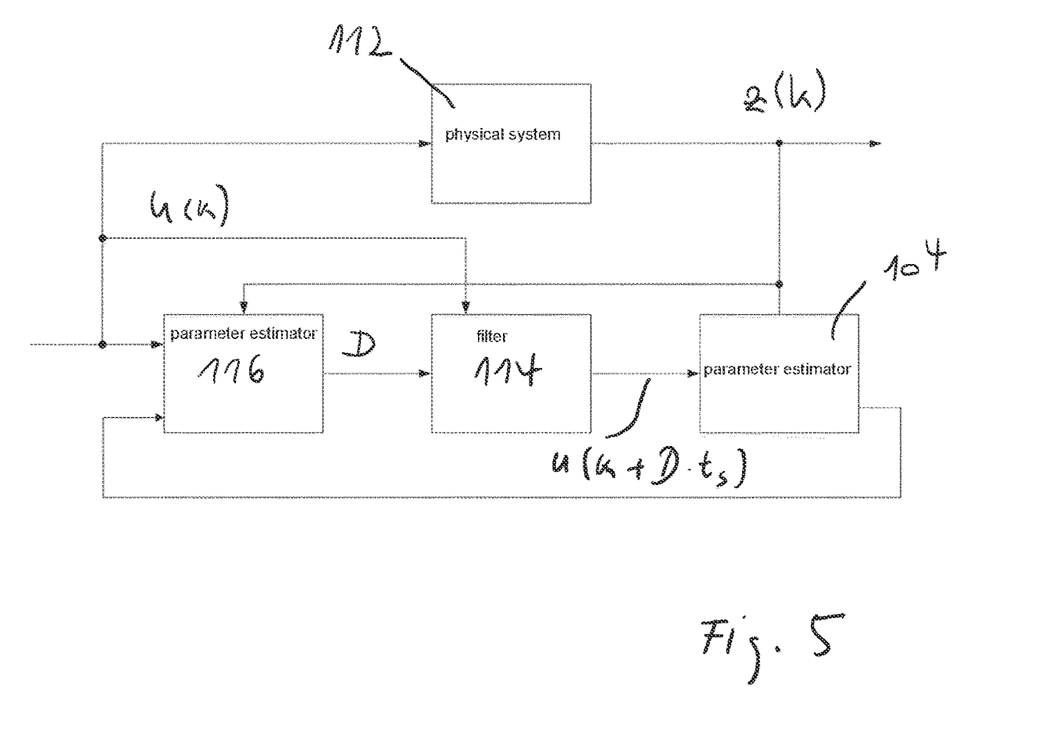
FIG. 5 shows the structural configuration of the filter structure for time synchronization, in accordance with an example embodiment of the present invention.

The structural configuration of the filter structure for time synchronization is shown in FIG. 5. An input variable u(k) arrives at a parameter estimator 116 for a delay D, at a physical system 112, and at a filter 114, in particular a so-called fractional delay filter. The detected measured variables z(k) are delivered both to parameter estimator 104 and to parameter estimator 116 for delay D. The delay D ascertained by parameter estimator 116 also arrives at filter 114. Filter 114 ascertains time-synchronous output variables u(k+D*ts), which are delivered to parameter estimator 104. Parameter estimator 104 ascertains, from the delivered time-synchronous input variables u(k+D*ts) and measured variables z(k), the estimated parameters Rb12 of wiring harness model 91. These parameters Rb12 estimated by parameter estimator 104 also arrive as input variables at parameter estimator 116 for the delay D.

The methods described above for sensor function and measurement error calibration require synchronous measured data. "Synchronous" means in this context that the starting time of the measurement is the same for all the measured variables ($U_v(k)$, $I_v(k)$, $U_{BATT}(k)$, $I_{BATT}(k)$, etc.).

In decentralized systems such as the vehicle energy system, however, this is not the case. The measurements are distributed among several sub-components that each use internal, independent clocks. The diagnostic result is therefore greatly influenced by the asynchronicity of the measured variables.

If the asynchronicity can be determined and eliminated, however, this has a positive effect on the diagnostic result. The synchronization concept that follows will be based on time-discrete measured variables that are present with the same sampling rate but exhibit a time shift with respect to one another that is equal to $D \cdot t_s$ (where $t_s$ is the sample time and D represents the delay factor between the signals as a linear factor related to the sample time).

Of the measured variables above, the following measured values are therefore available at the sampling point in time k (assuming that the time shift is identical for each measured variable of a specific component):

$$U_v(k), I_v(k), U_{BATT}(k+D \cdot t_s), I_{BATT}(k+D \cdot t_s)$$

To determine the delay factor D, a filtering operation that performs a time shift by an initial factor D is performed for all the measured variables u(k) that are to be delayed. This can be done by way of a so-called fractional delay filter 114. Implementation using a first-order Lagrange filter is described below.

$$u(k+D \cdot t_s) = (u(k) \cdot (1-D) + u(k-1) \cdot D)$$

The estimated output variable $h(k+D \cdot t_s)$ is thus calculated using the procedure described above.

The estimate of the new delay factor can then be calculated as follows:

$$D(k) = D(k-1) + [z(k) - h(k+D \cdot t_s)] \cdot [h(k-1+D \cdot t_s) - h(k+D \cdot t_s)]^{-1}$$

k=sampling point in time
z=measured output variable
h=output variable estimated from u via model equation.

If this measurement equation is implemented in a parameter estimator 116, the delay D can be estimated with the aid of the noise-affected measured variables u(k) and z(k).

The already calculated value for $u(k+D \cdot t_s)$ can be used for parameter estimation of the lead and contact resistances of the wiring harness. Alternatively, an additional higher-quality filtering operation (for example, a higher-order Lagrange filter) can be performed with the aid of the calculated factor D, and its output variables can then be delivered to the parameter estimation function. This has the advantage that a high signal quality for the delayed signals can be achieved with little computation outlay for estimating the factor D.

Parameter estimator 104 can be accommodated, for example, in vehicle electrical system diagnostic block 58 shown in FIG. 2, or can be part of vehicle electrical system diagnostic function 58. The corresponding measured values arrive, as shown in FIG. 2, at that vehicle electrical system diagnostic block 58.

The above-described method for ascertaining relevant characterizing variables of a partial vehicle electrical system 30, 40 in a motor vehicle is suitable in particular for systems in which a highly accurate prediction is necessary, for example in the autonomous driving mode. In all cases, corresponding countermeasures must be initiated quickly and reliably in the event of a possible error. The proposed parameter estimator 104 makes possible rapid and reliable diagnosis, and is therefore particularly suitable for this. The ascertained characterizing variables Rb12 and xk are thus made available to a higher-order vehicle electrical system diagnostic function in order to ensure reliable vehicle electrical system power to selected systems (for example, braking system, steering, surroundings sensing, control computer). If there are significant deviations in the characterizing variables of wiring harness model 91, an error datum is generated. That error datum is made available to the higher-order vehicle electrical system diagnostic function. When that error datum is present, countermeasures such as bringing the motor vehicle to a safe stop, or the like, are initiated as applicable. Alternatively, if the vehicle is not in the autonomous driving mode such a mode could be suppressed. Further information with regard to maintenance or diagnosis can also be initiated. If applicable, the ascertained characterizing variables can be corrected or ascertained on the basis of specific systematic measurement errors, in particular an error covariance Pk, a gain a, or a bias b, and/or an error datum can be generated as a function of the systematic measurement error.

What is claimed is:

1. A method for monitoring an energy supply in a motor vehicle, in which at least one energy reservoir supplies energy to several loads in a partial vehicle electrical system, the method comprising the following steps:
   detecting at least one at least one measured variable of the energy reservoir or of at least one load of the loads;
   providing at least one wiring harness model which models the partial vehicle electrical system;
   assessing, by a parameter estimator, at least one characterizing variable of the wiring harness model using the measured variable; and
   ascertaining, by the parameter estimator, a new characterizing variable at least when a current for excitation of the partial vehicle electrical system has a sufficient magnitude.

2. The method as recited in claim 1, wherein the loads are safety-relevant loads.

3. The method as recited in claim 1, wherein the characterizing variable of the wiring harness model is used to generate an error information item.

4. The method as recited in claim 3, wherein the characterizing variable of the wiring harness model is used to generate the error information model at least one of: (i) upon deviation of the characterizing variable from a limit value, or (ii) upon deviation of further characterizing variables which are determined depending on the characterizing variable of the wiring harness model, from a limit value.

5. The method as recited in claim 3, further comprising depending on the characterizing variable or on the error information item, transferring the vehicle into a safe operating state or suppressing an autonomous driving mode.

6. The method as recited in claim 1, wherein the parameter estimator includes at least one at least one predictor or at least one corrector.

7. The method as recited in claim 1, further comprising:
   updating, by the parameter estimator, the characterizing variable at least one of using the measured variable or a previous characterizing variable.

8. The method as recited in claim 1, wherein at least one load distributor is provided in the partial vehicle electrical system, the load distributor being supplied with energy by the energy reservoir, the load distributor supplying energy to several loads necessary for an autonomous driving mode, the measured variable being detected at the load distributor, and being delivered to the parameter estimator to ascertain the characterizing variable.

9. The method as recited in claim 1, wherein at least one separating element is provided in the partial vehicle electrical system, the measured variable being detected at the separating element and being delivered to the parameter estimator to ascertain the characterizing variable.

10. The method as recited in claim 9, wherein the separating element is a DC voltage converter.

11. A method for monitoring an energy supply in a motor vehicle, in which at least one energy reservoir supplies energy to several loads in a partial vehicle electrical system, the method comprising the following steps:
    detecting at least one at least one measured variable of the energy reservoir or of at least one load of the loads;
    providing at least one wiring harness model which models the partial vehicle electrical system;
    assessing, by a parameter estimator, at least one characterizing variable of the wiring harness model using the measured variable; and
    ascertaining, by the parameter estimator, a new characterizing variable at least when a current for excitation of the partial vehicle electrical system has a sufficient magnitude,
    wherein at least one of: (i) a contact resistance between the energy reservoir and a load distributor is used as the characterizing variable, (ii) a state vector that encompasses several contact resistances or lead resistances in branches of the partial vehicle electrical system is used as the characterizing variable.

12. A method for monitoring an energy supply in a motor vehicle, in which at least one energy reservoir supplies energy to several loads in a partial vehicle electrical system, the method comprising the following steps:
    detecting at least one at least one measured variable of the energy reservoir or of at least one load of the loads;
    providing at least one wiring harness model which models the partial vehicle electrical system;
    assessing, by a parameter estimator, at least one characterizing variable of the wiring harness model using the measured variable;
    ascertaining, by the parameter estimator, a new characterizing variable at least when a current for excitation of the partial vehicle electrical system has a sufficient magnitude; and
    ascertaining, by the parameter estimator, a systematic measurement error, the systematic measurement error being an error covariance, or a gain, or a bias, and at least one of: (i) the error information item is generated depending on the systematic measurement error, or (ii) the characterizing variable is corrected depending on the systematic measurement error.

13. The method as recited in claim 1, wherein a positive-side contact resistance and a ground-side contact resistance are assessed in total as the characterizing variable of the wiring harness model.

14. A method for monitoring an energy supply in a motor vehicle, in which at least one energy reservoir supplies energy to several loads in a partial vehicle electrical system, the method comprising the following steps:
    detecting at least one at least one measured variable of the energy reservoir or of at least one load of the loads;
    providing at least one wiring harness model which models the partial vehicle electrical system;
    assessing, by a parameter estimator, at least one characterizing variable of the wiring harness model using the measured variable; and
    ascertaining, by the parameter estimator, a new characterizing variable at least when a current for excitation of the partial vehicle electrical system has a sufficient magnitude, wherein the at least one measured variable includes a plurality of measured variables which are used to determine the characterizing variable, the measured variables being synchronized using a filter.

15. The method as recited in claim 14, wherein the filter is a fractional delay filter, or a Lagrange filter, or a Farrow filter.

16. The method as recited in claim 14, wherein for time synchronization of the measured variables, the filter determines a delay factor for all of the measured variables that are to be delayed.

17. The method as recited in claim 16, wherein the delay factor of the filter is determined by a second parameter estimator.

18. A method for monitoring an energy supply in a motor vehicle, in which at least one energy reservoir supplies energy to several loads in a partial vehicle electrical system, the method comprising the following steps:
   detecting at least one at least one measured variable of the energy reservoir or of at least one load of the loads;
   providing at least one wiring harness model which models the partial vehicle electrical system;
   assessing, by a parameter estimator, at least one characterizing variable of the wiring harness model using the measured variable; and
   ascertaining, by the parameter estimator, a new characterizing variable at least when a current for excitation of the partial vehicle electrical system has a sufficient magnitude,
   wherein a state estimator is used as the parameter estimator.

19. The method as recited in claim 18, wherein the state estimator is a Kalman filter, or an extended Kalman filter, or an unscented Kalman filter, or a recursive least-squares or particle filter.

20. A method for monitoring an energy supply in a motor vehicle, in which at least one energy reservoir supplies energy to several loads in a partial vehicle electrical system, the method comprising the following steps:
   detecting at least one at least one measured variable of the energy reservoir or of at least one load of the loads;
   providing at least one wiring harness model which models the partial vehicle electrical system;
   assessing, by a parameter estimator, at least one characterizing variable of the wiring harness model using the measured variable; and
   ascertaining, by the parameter estimator, a new characterizing variable at least when a current for excitation of the partial vehicle electrical system has a sufficient magnitude,
   wherein at least one of a predictive diagnosis, maintenance recommendation, or an operating strategy optimization are accomplished using a future characterizing variable.

* * * * *